(12) United States Patent
Nishihara

(10) Patent No.: US 10,157,964 B2
(45) Date of Patent: Dec. 18, 2018

(54) MEMORY DEVICE AND METHOD FOR MANUFACTURING THE SAME

(71) Applicant: Toshiba Memory Corporation, Minato-ku (JP)

(72) Inventor: Kiyohito Nishihara, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/684,306

(22) Filed: Aug. 23, 2017

(65) Prior Publication Data

US 2017/0352705 A1 Dec. 7, 2017

Related U.S. Application Data

(62) Division of application No. 14/621,966, filed on Feb. 13, 2015.

(60) Provisional application No. 62/035,137, filed on Aug. 8, 2014.

(51) Int. Cl.
*H01L 27/24* (2006.01)
*H01L 45/00* (2006.01)

(52) U.S. Cl.
CPC ........ *H01L 27/2463* (2013.01); *H01L 45/085* (2013.01); *H01L 45/1233* (2013.01); *H01L 45/1266* (2013.01); *H01L 45/148* (2013.01); *H01L 45/1675* (2013.01)

(58) Field of Classification Search
None
See application file for complete search history.

(56) References Cited

U.S. PATENT DOCUMENTS

| | | | |
|---|---|---|---|
| 7,888,665 B2 | 2/2011 | Happ et al. | |
| 8,519,371 B2 | 8/2013 | Fukumizu et al. | |
| 8,581,226 B2* | 11/2013 | Takahashi | G11C 13/0007 257/296 |
| 2007/0090461 A1 | 4/2007 | Eliason | |
| 2010/0203672 A1 | 8/2010 | Eun | |
| 2010/0213433 A1* | 8/2010 | Yamamoto | G11C 13/0007 257/4 |
| 2011/0031463 A1* | 2/2011 | Sato | H01L 45/12 257/4 |
| 2012/0175581 A1 | 7/2012 | Hwang | |
| 2013/0064001 A1 | 3/2013 | Terai | |
| 2013/0181184 A1 | 7/2013 | Sakuma | |
| 2014/0146592 A1 | 5/2014 | Karpov | |
| 2015/0144859 A1 | 5/2015 | Chen | |
| 2015/0287918 A1 | 10/2015 | Dang | |

* cited by examiner

*Primary Examiner* — Tom Thomas
*Assistant Examiner* — Nilufa Rahim
(74) *Attorney, Agent, or Firm* — Oblon, McClelland, Maier & Neustadt, L.L.P.

(57) ABSTRACT

A memory device according to one embodiment includes a resistance change film, an insulating film provided on the resistance change film, a first wiring provided on the insulating film and being not in contact with the resistance change film, and a high resistance film having a higher resistivity than the first wiring. The high resistance film is provided on a side surface of a stacked body including the insulating film and the first wiring, and the high resistance film is electrically connected between the first wiring and the resistance change film.

20 Claims, 15 Drawing Sheets

MEMORY DEVICE AND METHOD FOR MANUFACTURING THE SAME

CROSS-REFERENCE TO RELATED APPLICATIONS

This application is a divisional of U.S. application Ser. No. 14/621,966 filed Feb. 13, 2015, and is based upon and claims the benefit of priority from U.S. Provisional Patent Application 62/035,137, filed on Aug. 8, 2014; the entire contents of each of which are incorporated herein by reference.

FIELD

Embodiments described herein relate generally to a memory device and a method for manufacturing the same.

BACKGROUND

Recently, there has been proposed a memory device for storing data by changing the electrical resistance of memory cells. In improving the memory density of such a memory device, it is advantageous to integrate a large number of memory cells in a cross-point structure. On the other hand, each memory cell is preferably provided with a current limiting layer for preventing excessive flow of current.

DETAILED DESCRIPTION

In general, a memory device according to one embodiment includes a resistance change film, an insulating film provided on the resistance change film, a first wiring provided on the insulating film and being not in contact with the resistance change film, and a high resistance film having a higher resistivity than the first wiring. The high resistance film is provided on a side surface of a stacked body including the insulating film and the first wiring, and the high resistance film is electrically connected between the first wiring and the resistance change film.

Embodiments of the invention will now be described with reference to the drawings.

First Embodiment

First, a first embodiment is described.

Figure 1:
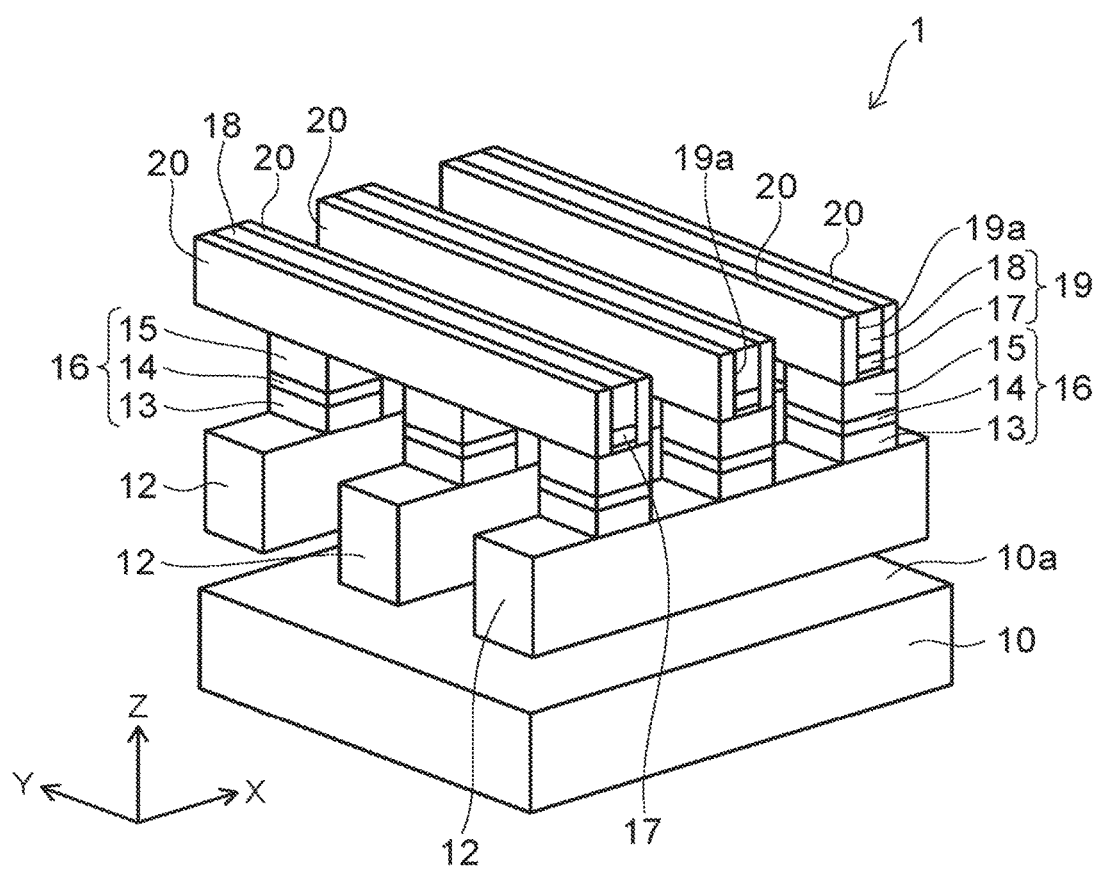
FIG. 1 is a perspective view showing a memory device according to a first embodiment.

FIG. 1 is a perspective view showing a memory device according to the embodiment.

For convenience of illustration, the interlayer insulating film is not shown in FIG. 1.

As shown in FIG. 1, the memory device 1 according to the embodiment includes a silicon substrate 10.

In the following, for convenience of description, an XYZ orthogonal coordinate system is adopted in this specification. Two directions parallel to the upper surface 10a of the silicon substrate 10 and orthogonal to each other are referred to as "X-direction" and "Y-direction". The direction perpendicular to the upper surface 10a is referred to as "Z-direction".

An interlayer insulating film 11 (see FIG. 12B) is provided on the silicon substrate 10. The interlayer insulating film 11 is formed from an insulating material such as silicon oxide ($SiO_2$). A plurality of word lines 12 extending in the X-direction are provided in the interlayer insulating film 11. The word lines 12 are arranged periodically in the Y-direction. The word line 12 is formed from a conductive material such as tungsten (W). The plurality of word lines 12 placed on the same XY-plane constitute a word line wiring layer.

A resistance change layer 13 is provided intermittently along the X-direction directly above each word line 12. In the memory device 1 as a whole, a plurality of resistance change layers 13 are arranged in a matrix along the X-direction and the Y-direction. The resistance change layer 13 is formed from e.g. amorphous silicon (a-Si) or silicon oxide ($SiO_2$).

A metal layer 14 is provided directly above each resistance change layer 13. The metal layer 14 is in contact with the resistance change layer 13. The metal layer 14 contains a metal element, e.g. silver (Ag), cobalt (Co), nickel (Ni), or copper (Cu), the ion of which can migrate in the resistance change layer 13. For instance, the metal layer 14 is formed from silver. The resistance change layer 13 and the metal layer 14 constitute a resistance change film. The resistance change film is a film with variable resistance.

An electrode 15 is provided directly above each metal layer 14. The electrode 15 is formed from a conductive material such as tungsten. The resistance change layer 13, the metal layer 14, and the electrode 15 form a pillar 16 extending in the Z-direction. The pillar 16 is shaped like e.g. a quadrangular column.

A plurality of insulating films 17 extending in the Y-direction are provided on the electrode 15. The insulating film 17 is formed from an insulating material, e.g., silicon oxide or silicon nitride ($Si_3N_4$). Each insulating film 17 is shaped like a strip. Each insulating film 17 passes through the region directly above a plurality of pillars 16 arranged in a line along the Y-direction. The width or X-direction length of the insulating film 17 is narrower than the width or X-direction length of the electrode 15. Thus, each insulating film 17 is placed in a central region in the region directly above the corresponding electrode 15 except both X-direction end parts, and in a region between the central regions of the electrodes 15 adjacent in the Y-direction.

A bit line 18 extending in the Y-direction is provided directly above the insulating film 17. The bit line 18 is formed from a conductive material such as tungsten. The plurality of bit lines 18 placed on the same XY-plane constitute a bit line wiring layer. The insulating film 17 and the bit line 18 constitute a stacked body 19. The width or X-direction length of the stacked body 19 is narrower than the width or X-direction length of the pillar 16.

A high resistance film 20 is provided on both side surfaces 19a directed in the X-direction of the stacked body 19. The resistivity of the high resistance film 20 is higher than the resistivity of the word line 12, the resistivity of the electrode 15, and the resistivity of the bit line 18, but lower than the resistivity of the insulating film 17. The high resistance film 20 is formed from e.g. tantalum silicon nitride (TaSiN).

The side surface of the high resistance film 20 is in contact with the side surface of the bit line 18. Thus, the high resistance film 20 is connected to the bit line 18. The lower end of the high resistance film 20 is in contact with the upper surface of the electrode 15. Thus, the high resistance film 20 is connected to the electrode 15. On the other hand, the bit line 18 is not in contact with the electrode 15. The insulating film 17 is interposed between the bit line 18 and the electrode 15. Thus, the bit line 18 is connected to the electrode 15 through the high resistance film 20. Furthermore, the electrode 15 is connected to the word line 12 through the metal layer 14 and the resistance change layer 13. Furthermore, in the case where the filament 25 described later is not formed in the resistance change layer 13, the resistivity of the resistance change layer 13 is higher than the resistivity of the word line 12, the resistivity of the electrode 15, and the resistivity of the bit line 18.

Next, a method for manufacturing a memory device according to the embodiment is described.

FIGS. 2A to 12B show a method for manufacturing a memory device according to the embodiment.

Figure 2A:
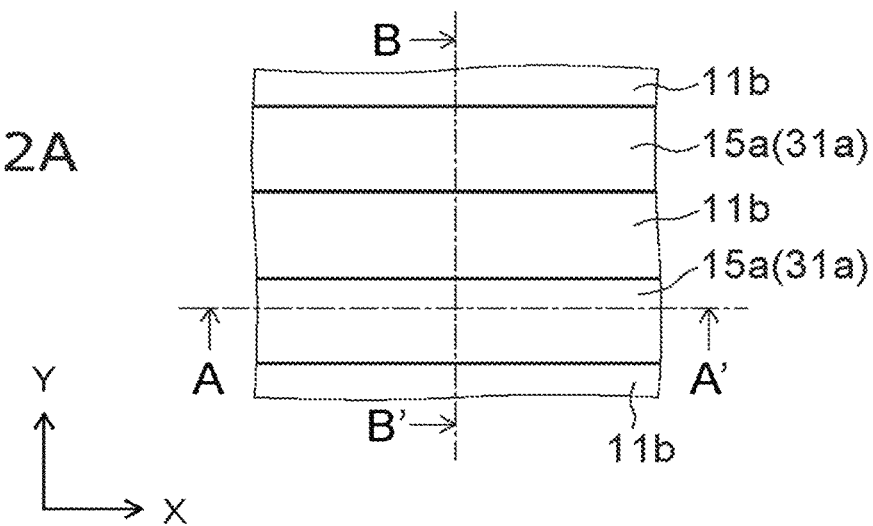
FIGS. 2A to 12B show a method for manufacturing a memory device according to the first embodiment.
Figure 2B:
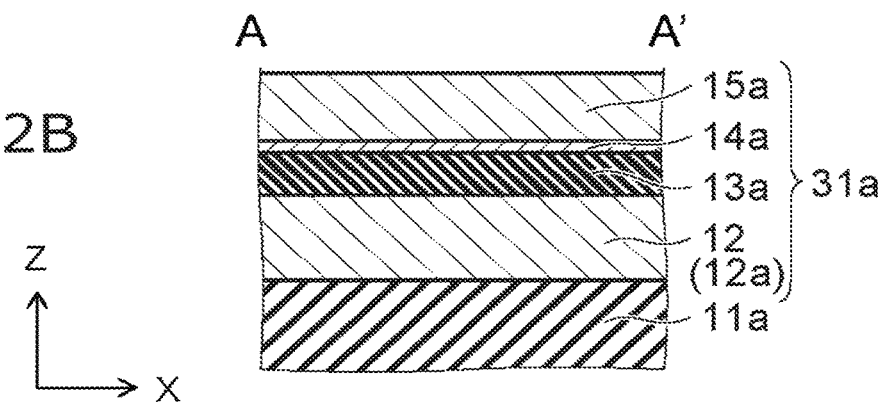
Figure 2C:
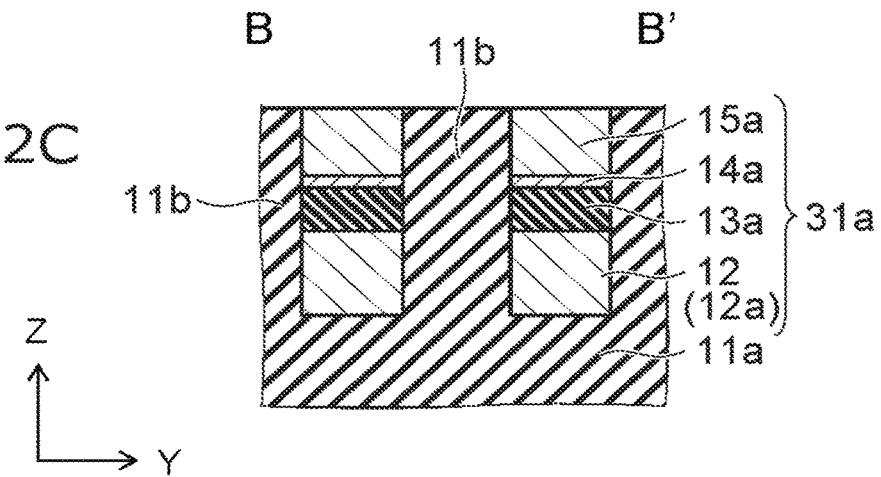
Figure 3A:
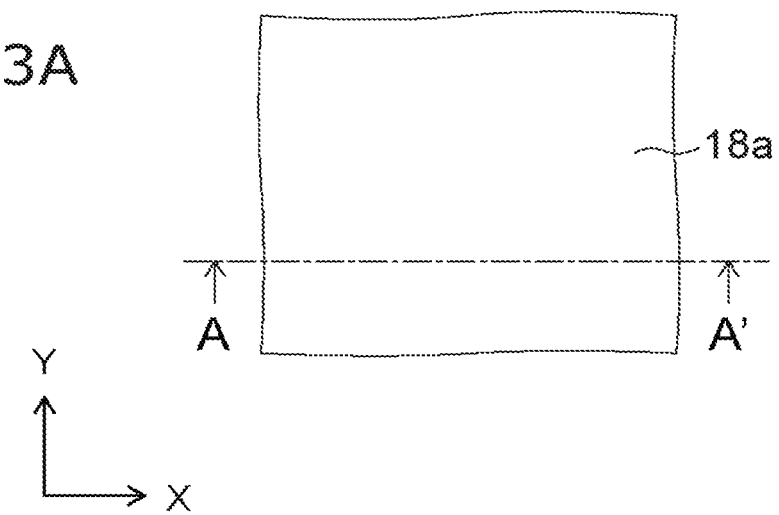
Figure 3B:
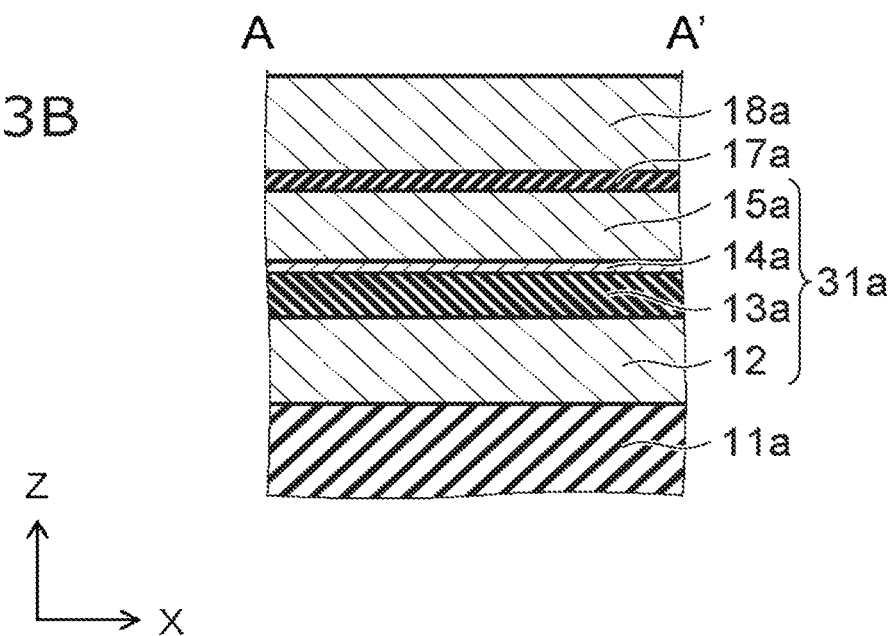

FIG. 2A is a plan view. FIG. 2B is a sectional view taken along line A-A' shown in FIG. 2A. FIG. 2C is a sectional view taken along line B-B' shown in FIG. 2A. Furthermore, FIG. 3A is a plan view. FIG. 3B is a sectional view taken along line A-A' shown in FIG. 3A. This also similarly applies to FIGS. 4A to 12B.

First, as shown in FIGS. 2A to 2C, an interlayer insulating film 11a is formed on a silicon substrate 10 (see FIG. 1). Next, a word line film 12a, a resistance change layer 13a, a metal layer 14a, and an electrode film 15a are formed in this order. Next, the stacked film composed of the word line film 12a, the resistance change layer 13a, the metal layer 14a, and the electrode film 15a is selectively removed and processed into a line-and-space pattern extending in the X-direction. Thus, a plurality of stacked bodies 31a extending in the X-direction are formed. At this time, the word line film 12a is divided into a plurality of word lines 12 extending in the X-direction.

Next, an interlayer insulating film 11b is embedded between the stacked bodies 31a. In FIG. 2C, the interlayer insulating films 11a and 11b are shown integrally. Next, the upper surface of the interlayer insulating film 11b is subjected to CMP (chemical mechanical polishing) using the electrode film 15a as a stopper. Thus, the upper surface of the interlayer insulating film 11b is set to the same position in the Z-direction as the upper surface of the stacked body 31a.

Next, as shown in FIGS. 3A and 3B, an insulating film 17a is formed by depositing an insulating material such as silicon oxide on the stacked body 31a and the interlayer insulating film 11b. Next, a bit line film 18a is formed by depositing a conductive material such as tungsten.

Figure 4A:
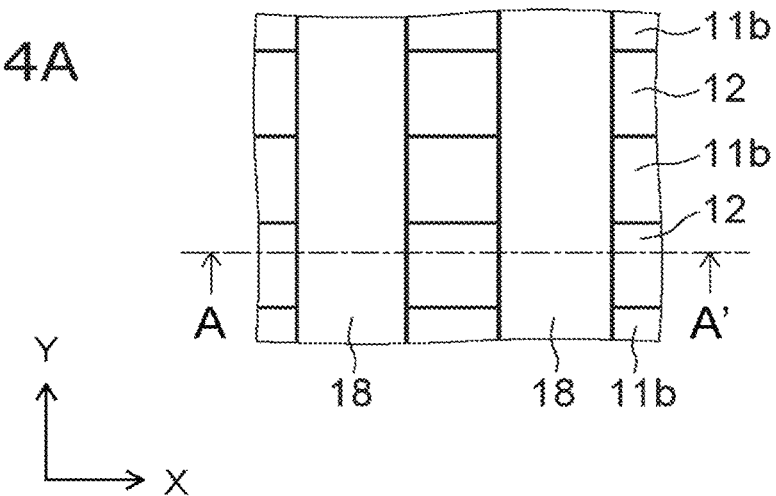
Figure 4B:
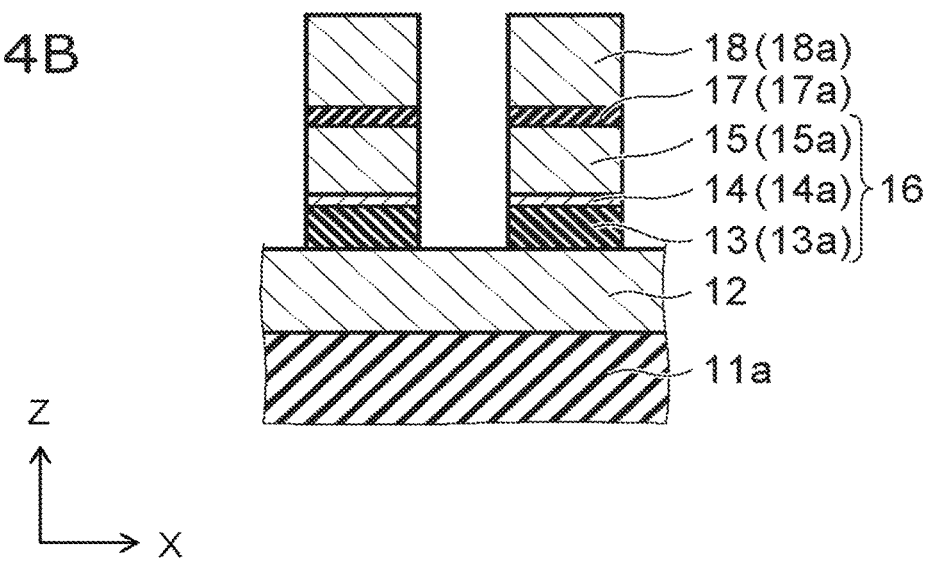

Next, as shown in FIGS. 4A and 4B, the stacked body composed of the bit line film 18a, the insulating film 17a, the electrode film 15a, the metal layer 14a, and the resistance change layer 13a is selectively removed by anisotropic etching such as RIE (reactive ion etching). Thus, the stacked body is processed into a line-and-space pattern extending in the Y-direction. However, the word line 12 and the interlayer insulating films 11b and 11a are not processed. Thus, the bit line film 18a and the insulating film 17a are processed into strips extending in the Y-direction and constitute a plurality of bit lines 18 and insulating films 17, respectively. The electrode film 15a, the metal layer 14a, and the resistance change layer 13a are divided in a matrix along both the X-direction and the Y-direction and constitute an electrode 15, a metal layer 14, and a resistance change layer 13, respectively. As a result, a pillar 16 is formed.

Figure 5A:
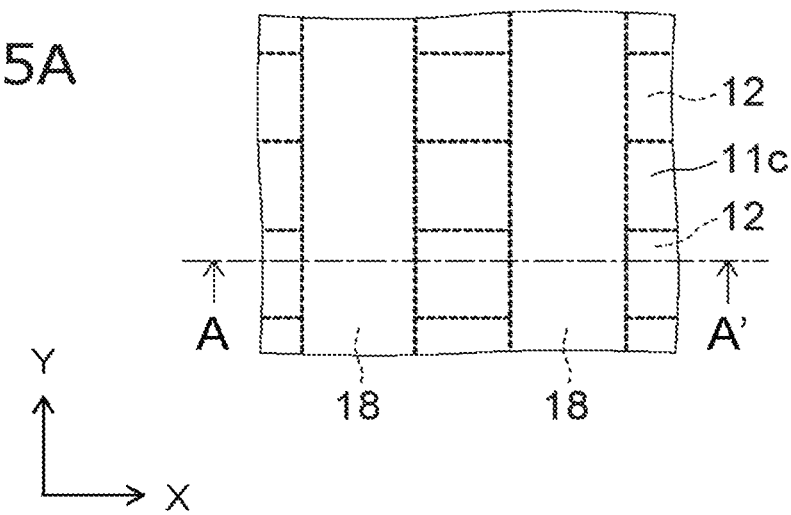
Figure 5B:
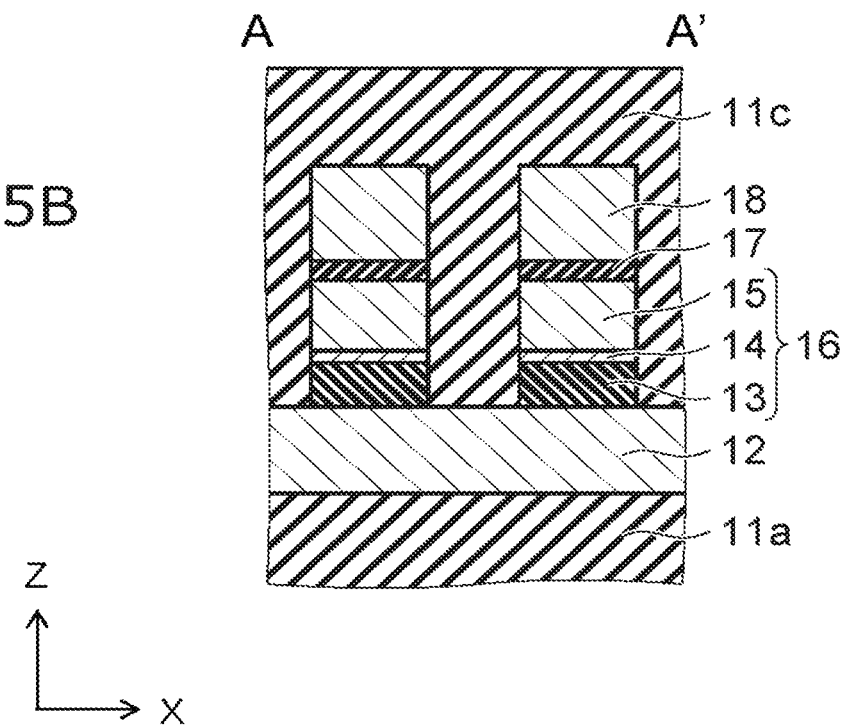

Next, as shown in FIGS. 5A and 5B, an insulating material is deposited on the entire surface to form an interlayer insulating film 11c. The interlayer insulating film 11c covers the pillar 16, the insulating film 17, and the bit line 18.

Figure 6A:
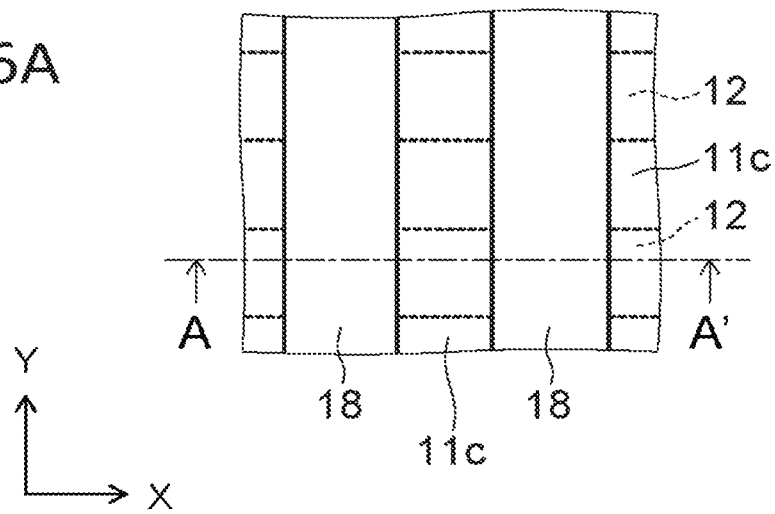
Figure 6B:
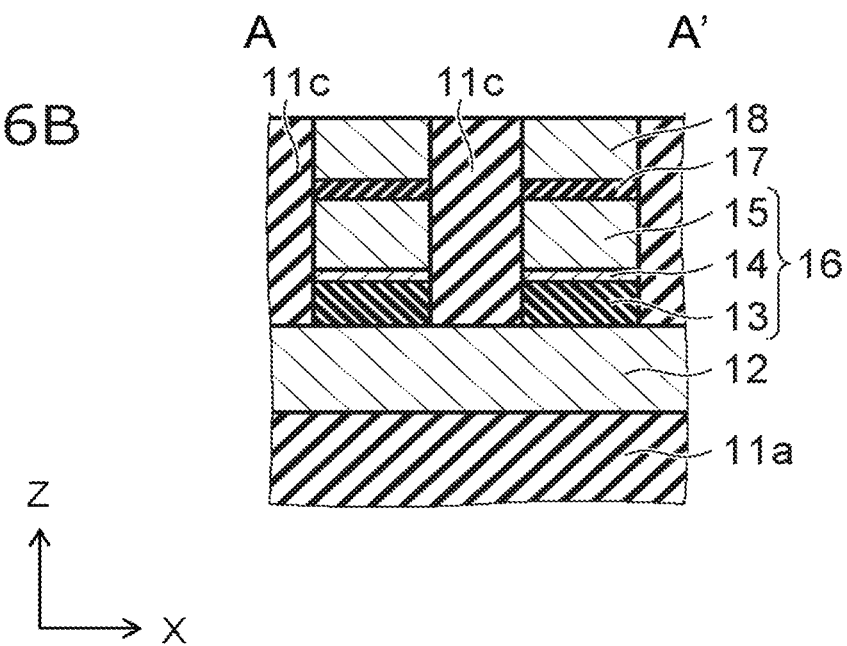

Next, as shown in FIGS. 6A and 6B, the upper surface of the interlayer insulating film 11c is subjected to CMP using the bit line 18 as a stopper. Thus, the upper surface of the interlayer insulating film 11c is set to the same position in the Z-direction as the upper surface of the bit line 18.

Figure 7A:
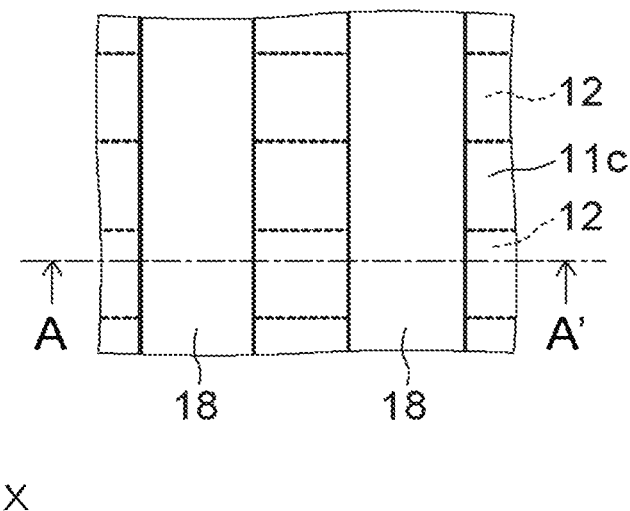
Figure 7B:
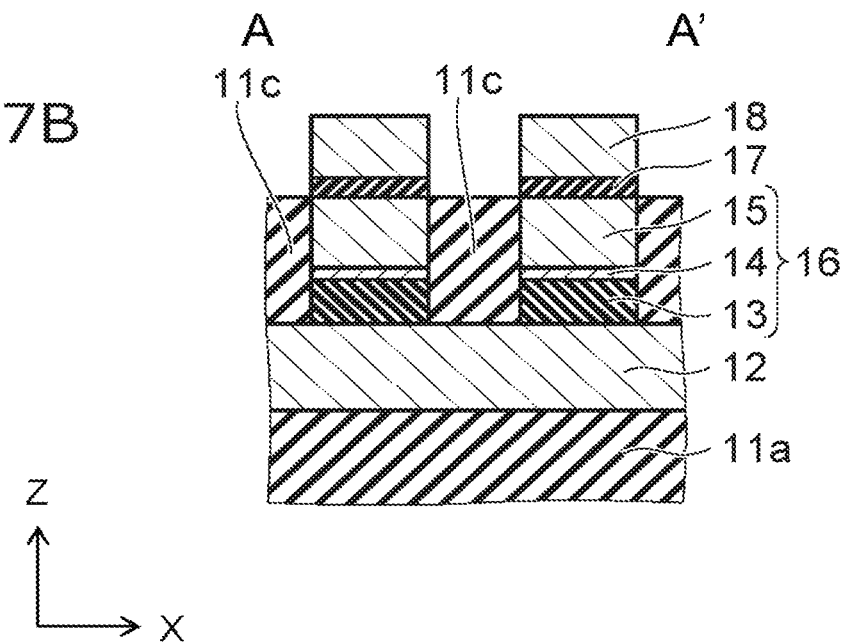

Next, as shown in FIGS. 7A and 7B, the interlayer insulating film 11c is etched back. Thus, the upper surface of the interlayer insulating film 11c is set back close to the interface between the electrode 15 and the insulating film 17.

Figure 8A:
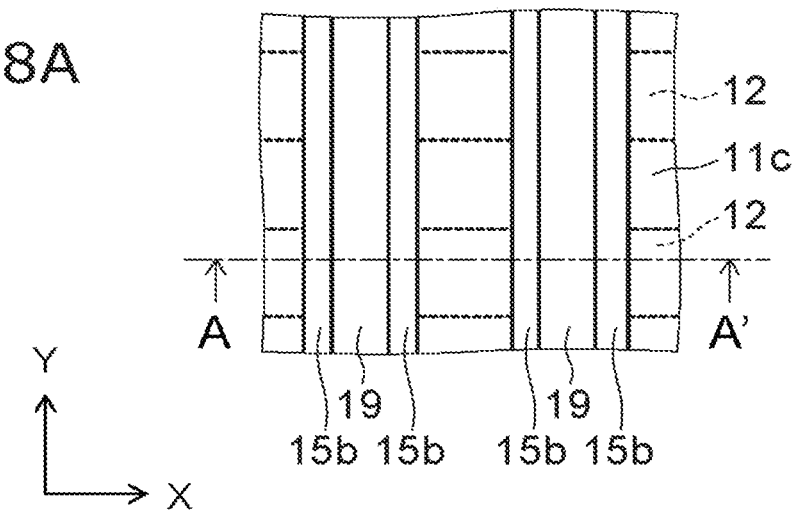
Figure 8B:
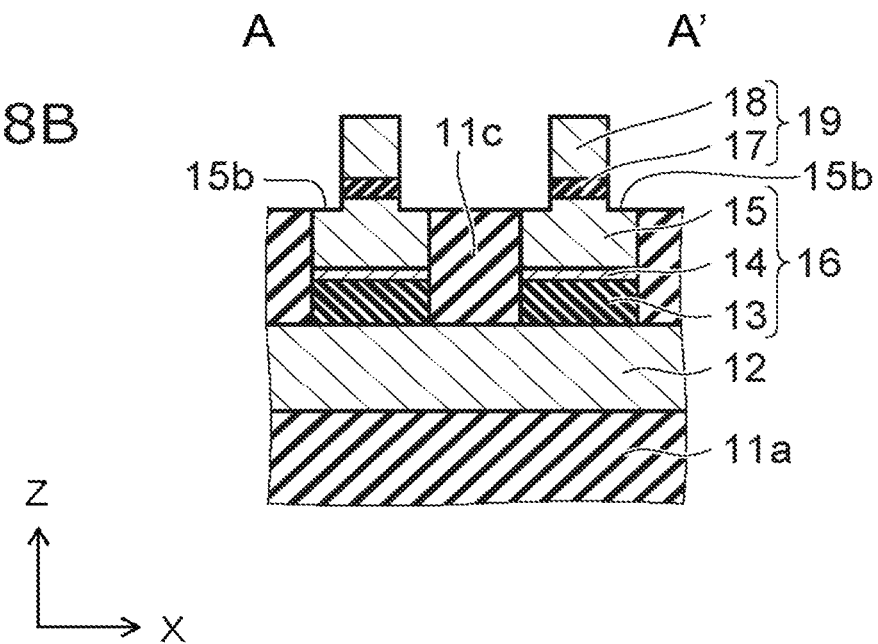

Next, as shown in FIGS. 8A and 8B, the bit line 18 and the insulating film 17 are subjected to isotropic etching. Thus, the width or X-direction length of the stacked body 19 including the bit line 18 and the insulating film 17 is reduced. As a result, the regions 15b on both X-direction end parts of the upper surface of the electrode 15 are exposed. In this isotropic etching, the upper part of the electrode 15 and the upper part of the interlayer insulating film 11c are also etched to some extent.

Figure 9A:
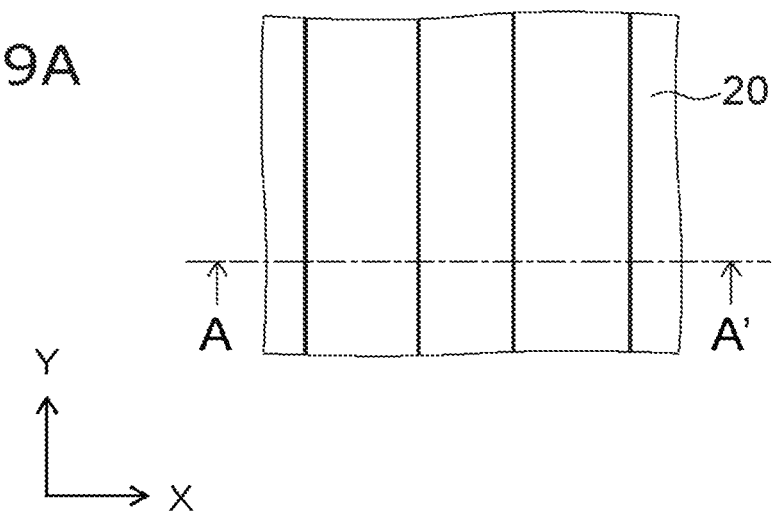
Figure 9B:
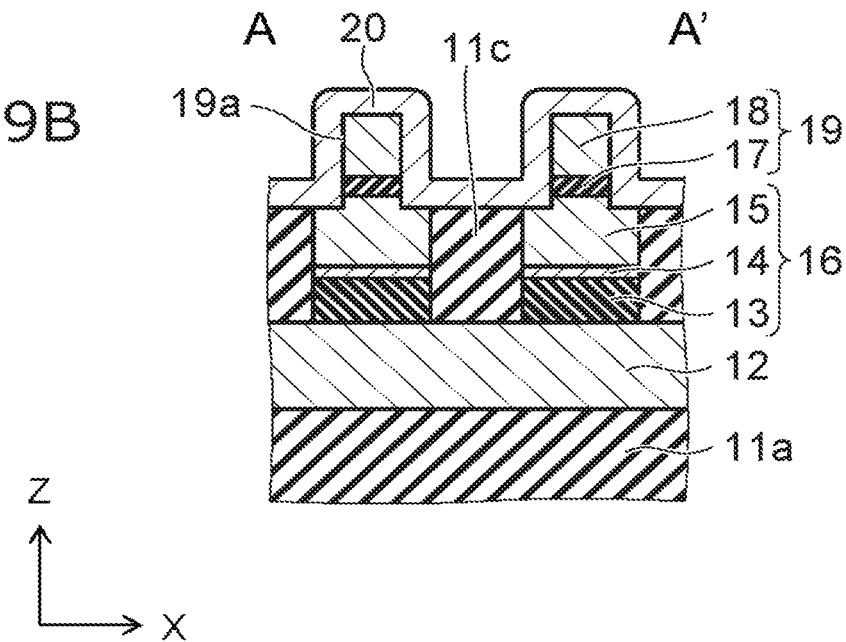

Next, as shown in FIGS. 9A and 9B, a high resistance material such as tantalum silicon nitride (TaSiN) is deposited on the entire surface by e.g. sputtering technique to form a high resistance film 20. The high resistance film 20 covers the upper surface and the side surface of the stacked body 19.

Figure 10A:
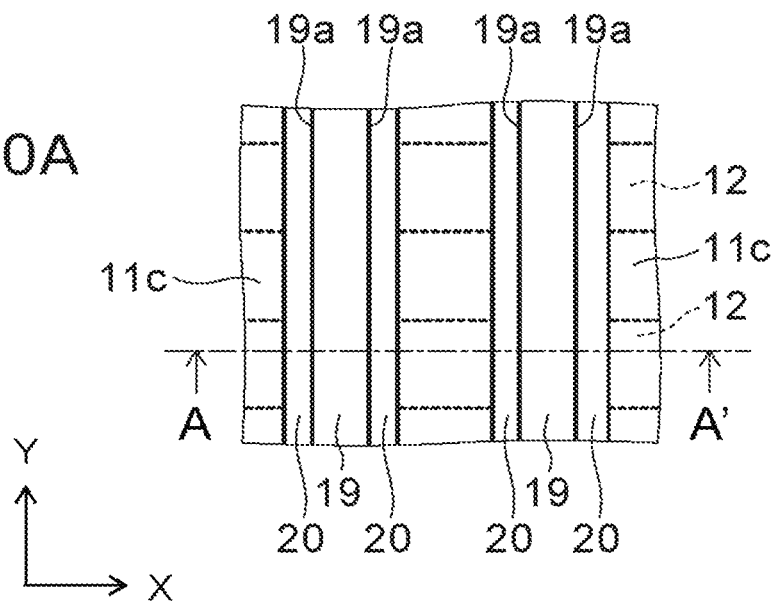
Figure 10B:
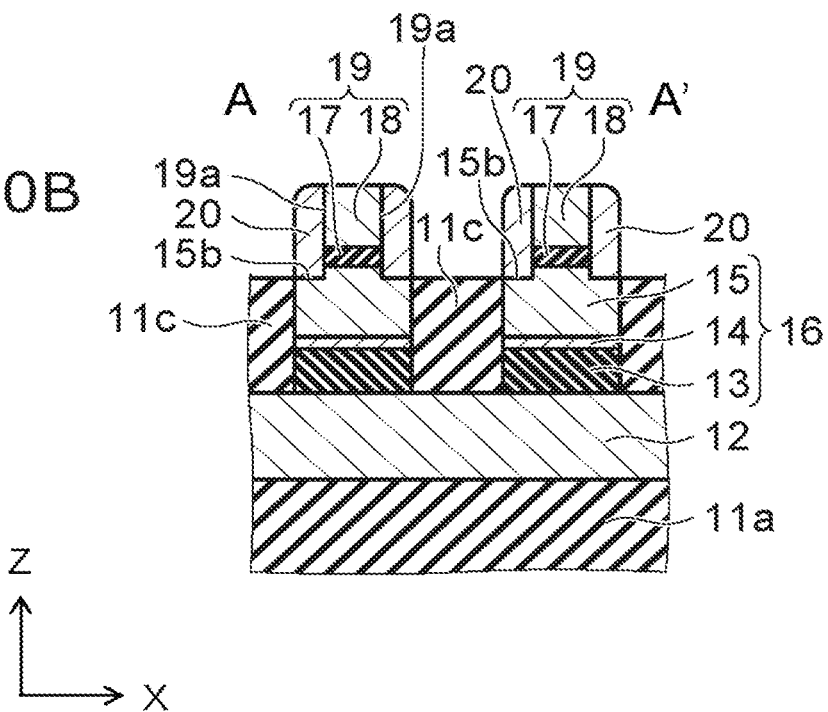

Next, as shown in FIGS. 10A and 10B, the high resistance film 20 is subjected to anisotropic etching such as RIE. Thus, the high resistance film 20 is removed from above the upper surface of the interlayer insulating film 11c and from above the upper surface of the stacked body 19. However, the high resistance film 20 is left on the side surface 19a of the stacked body 19 and on the region 15b of the electrode 15.

Figure 11A:
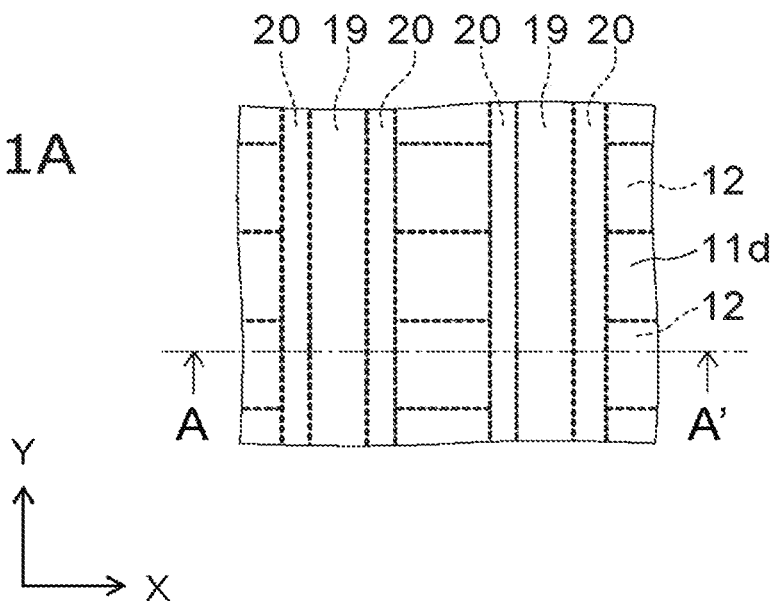
Figure 11B:
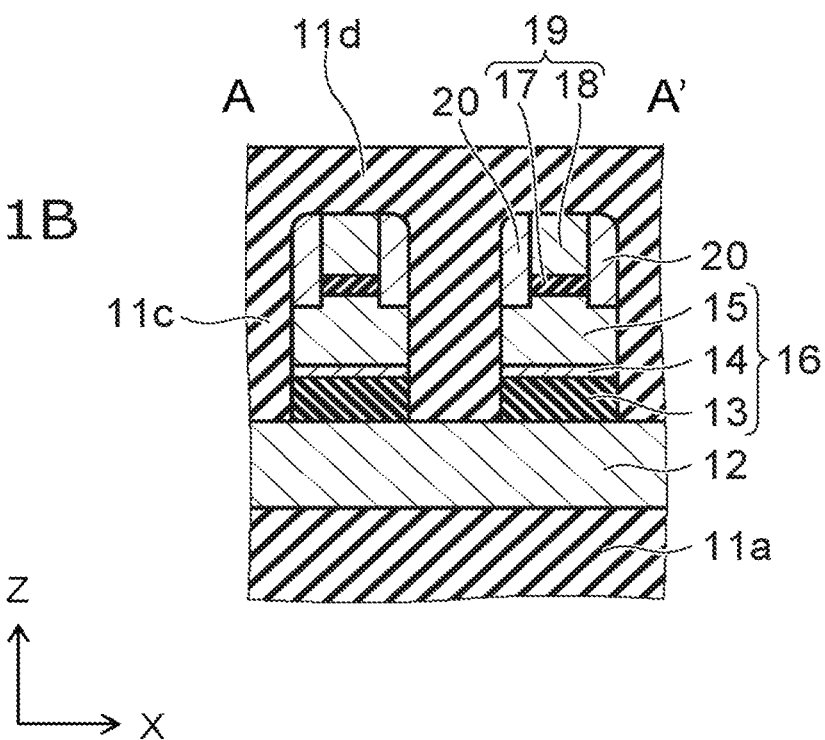

Next, as shown in FIGS. 11A and 11B, an insulating material is deposited on the entire surface. Thus, an interlayer insulating film 11d is formed on the interlayer insulating film 11c so as to cover the stacked body 19 and the high resistance film 20.

Figure 12A:
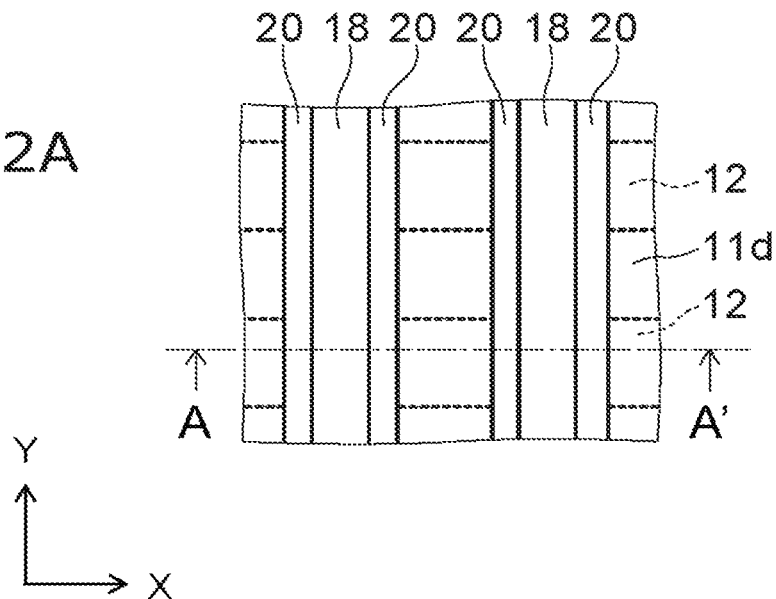
Figure 12B:
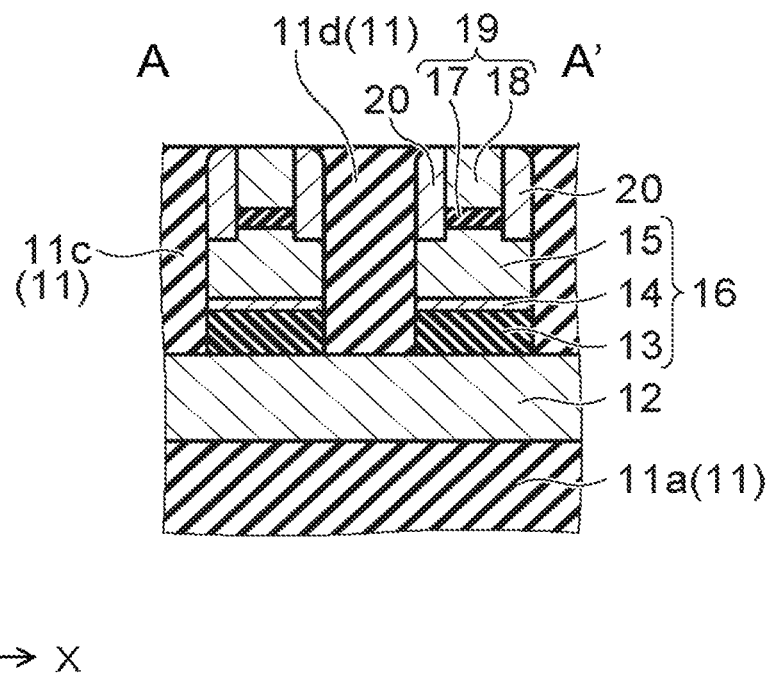

Next, as shown in FIGS. 12A and 12B, the upper surface of the interlayer insulating film 11d is subjected to CMP using the bit line 18 as a stopper. Thus, the upper surface of the interlayer insulating film 11d is set to the same position in the Z-direction as the upper surface of the bit line 18.

Thus, the memory device 1 shown in FIG. 1 is manufactured. Here, the interlayer insulating films 11a-11d constitute part of the interlayer insulating film 11.

Next, the operation of the memory device according to the embodiment is described.

Figure 13:
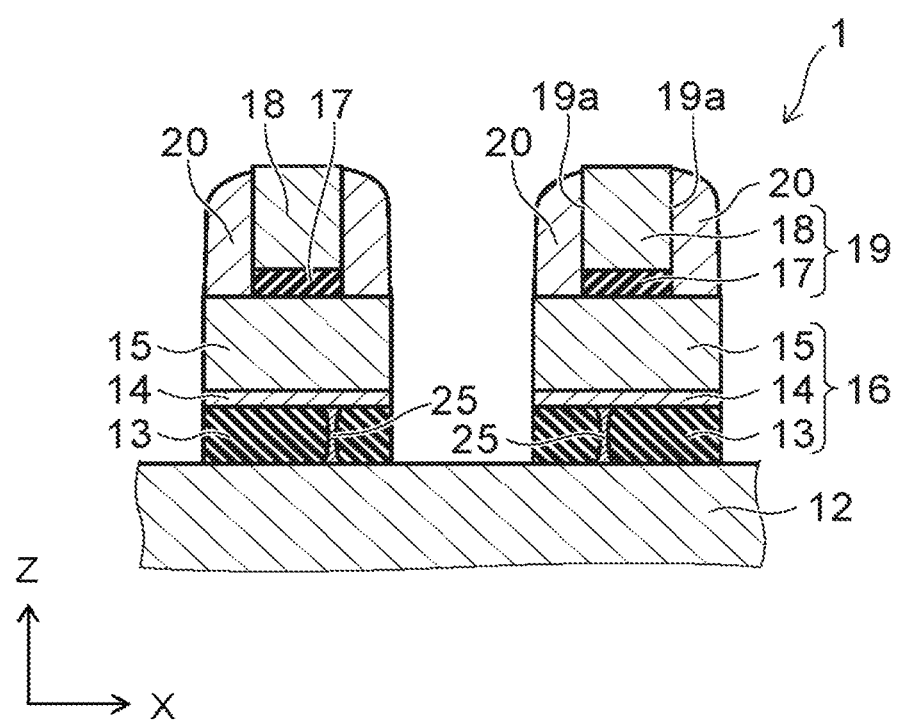
FIG. 13 is a sectional view showing an operation of the memory device according to the first embodiment.

FIG. 13 is a sectional view showing the operation of the memory device according to the embodiment.

The resistivity of the resistance change layer 13 is higher than the resistivity of the word line 12 and the bit line 18. Thus, when the filament 25 described later is not formed, the resistance change layer 13 is in a high resistance state. Here, as shown in FIG. 13, a positive voltage with the bit line 18 serving as a positive electrode and the word line 12 serving as a negative electrode is applied between the bit line 18 and the word line 12. Then, the metal such as silver contained in the metal layer 14 is ionized into a cation ($Ag^+$) and migrates toward the word line 12 serving as a negative electrode. Furthermore, in the resistance change layer 13, the cation is combined with an electron supplied from the word line 12 and precipitated as a silver atom. Thus, a filament 25 is formed in the resistance change layer 13 and constitutes a current path. As a result, the resistance of the resistance change layer 13 is decreased. Thus, the resistance change layer 13 turns to a low resistance state.

Here, the bit line 18 and the electrode 15 are separated from each other by the insulating film 17 and not in direct contact with each other. Thus, the bit line 18 is connected to the electrode 15 through the high resistance film 20. As a result, a current path from the bit line 18 through the high resistance film 20, the electrode 15, the metal layer 14, and the resistance change layer 13 (filament 25) to the word line 12 is formed between the bit line 18 and the word line 12. Furthermore, the high resistance film 20 functions as a current limiting layer and suppresses the amount of current. Thus, no excessive current flows in the aforementioned current path. Accordingly, the pillar 16 is not destroyed by overcurrent.

On the other hand, a negative voltage with the bit line 18 serving as a negative electrode and the word line 12 serving as a positive electrode may be applied between the bit line 18 and the word line 12. Then, the silver atom forming the filament 25 turns to a cation and migrates toward the bit line 18 serving as a negative electrode. This eliminates part of the filament 25 and breaks the current path. As a result, the resistance of the resistance change layer 13 is increased. Thus, the resistance change layer 13 returns to the high resistance state.

Thus, one bit of data can be stored by realizing two levels of resistance states in the resistance change layer 13. That is, a memory cell can be formed for each pillar 16.

Next, the effect of the embodiment is described.

In the memory device 1 according to the embodiment, the high resistance film 20 is connected between the bit line 18 and the electrode 15. Thus, the high resistance film 20 functions as a current limiting layer. Accordingly, no excessive current flows in each pillar 16.

In the embodiment, in the steps shown in FIGS. 9A and 9B and FIGS. 10A and 10B, the high resistance film 20 is formed on the side surface 19a of the stacked body 19. Thus, in the step shown in FIGS. 4A and 4B, when the bit line film 18a, the insulating film 17a, the electrode film 15a, the metal layer 14a, and the resistance change layer 13a are processed, the high resistance film 20 has not been formed yet. Accordingly, there is no need to process the high resistance film 20. Thus, in the step shown in FIGS. 4A and 4B, the aspect ratio of processing is lower. Accordingly, trouble due to processing failure is less likely to occur. As a result, the yield of the memory device 1 is increased.

Furthermore, in the embodiment, the high resistance film 20 is formed as a sidewall of the stacked body 19. Thus, the width of the high resistance film 20 can be controlled by the amount of deposition of the high resistance material. This facilitates forming a thin high resistance film 20. As a result, the current path formed in the high resistance film 20 can be provided with high resistance even if the current path is not lengthened by excessively thickening the insulating film 17. This can also reduce the aspect ratio of processing shown in FIGS. 4A and 4B.

Comparative Example

Next, a comparative example is described.

Figure 14A:
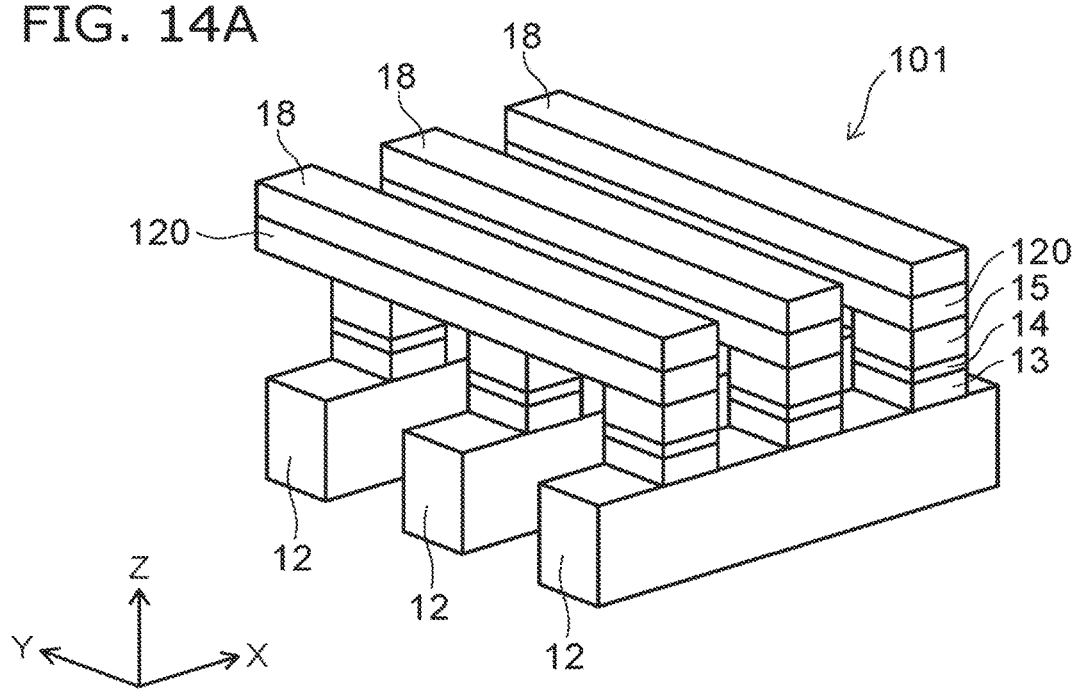
FIG. 14A is a perspective view showing a memory device according to a comparative example.
Figure 14B:
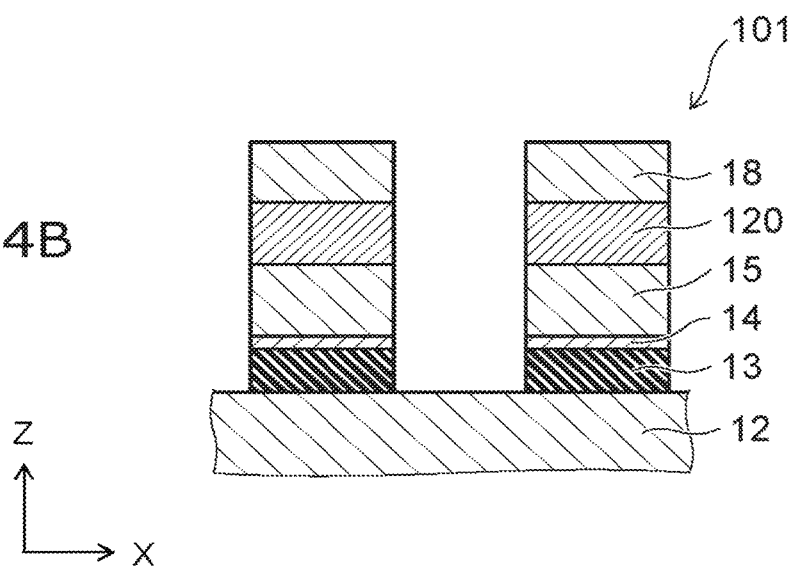
FIG. 14B is a sectional view thereof.

FIG. 14A is a perspective view showing a memory device according to this comparative example. FIG. 14B is a sectional view thereof.

As shown in FIGS. 14A and 14B, in the memory device 101 according to the comparative example, the high resistance film 120 is shaped not like a sidewall, but like a strip extending in the Y-direction. The high resistance film 120 is placed between the bit line 18 and the electrode 15. Furthermore, the memory device 101 does not include the insulating film 17 (see FIG. 1).

In this comparative example, when the bit line 18, the electrode 15, the metal layer 14, and the resistance change layer 13 are processed by anisotropic etching, the high resistance film 120 also needs to be processed. Thus, the aspect ratio of processing is higher. As a result, processing is made difficult. This decreases the yield of the memory device 101. Here, it is also considered that the high resistance film 120 may be thinned in order to reduce the aspect ratio of processing. However, in this case, it is difficult to provide a desired resistance to the high resistance film 120.

Second Embodiment

Next, a second embodiment is described.

Figure 15:
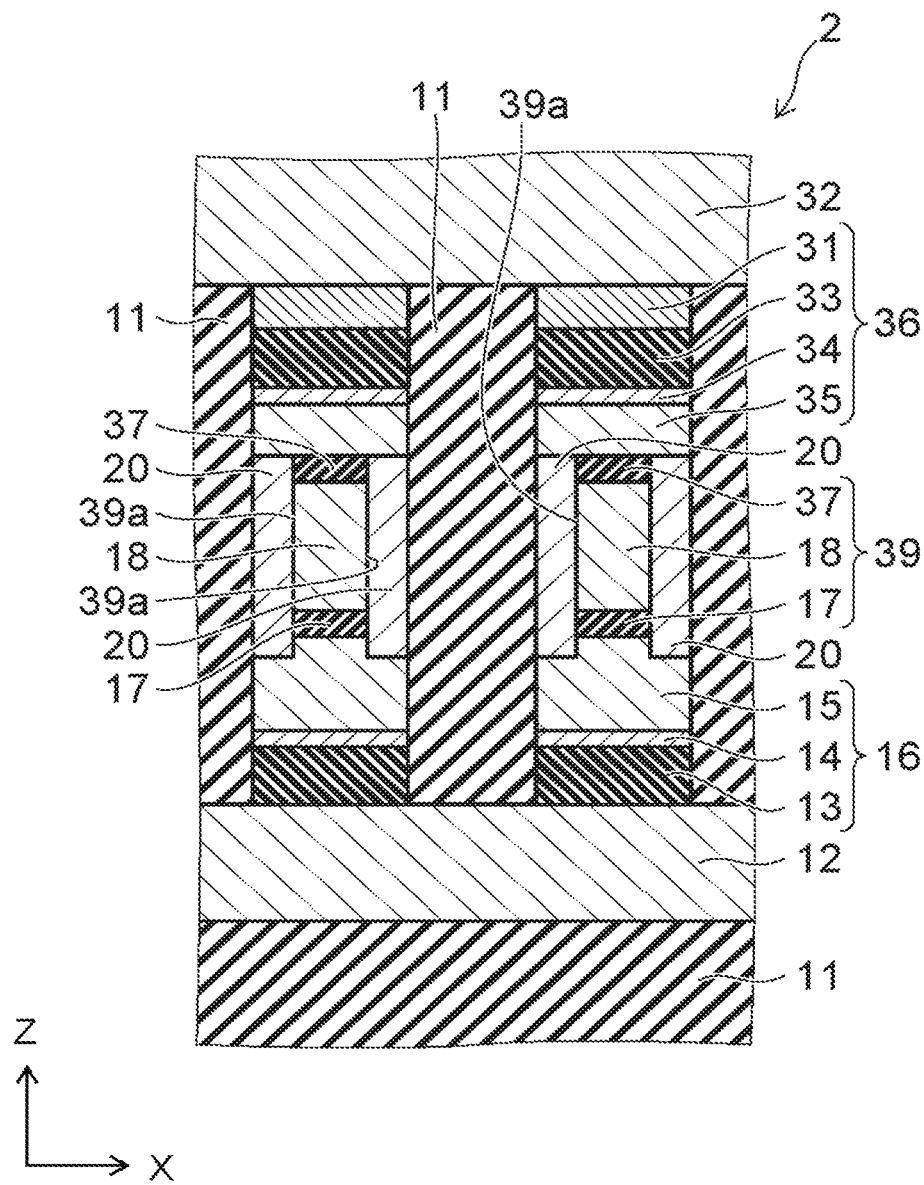
FIG. 15 is a sectional view showing a memory device according to a second embodiment.

FIG. 15 is a sectional view showing a memory device according to the embodiment.

As shown in FIG. 15, in the memory device 2 according to the embodiment, an insulating film 37 shaped like a strip extending in the Y-direction is provided directly above the bit line 18. The high resistance film 20 is provided on a side surface 39a directed in the X-direction of the stacked body 39 composed of the insulating film 17, the bit line 18, and the insulating film 37.

Furthermore, an electrode 35 is provided on the insulating film 37 and the high resistance film 20. The electrode 35 is provided directly above the electrode 15. The electrode 35 is divided along both the X-direction and the Y-direction. A metal layer 34, a resistance change layer 33, and an electrode 31 are stacked in this order directly above the electrode 35. The metal layer 34 and the resistance change layer 33 constitute a resistance change film. The electrode 35, the metal layer 34, the resistance change layer 33, and the electrode 31 constitute a pillar 36 extending in the Z-direction. The pillar 36 is placed directly above the pillar 16.

The electrode 35 and the electrode 31 are formed from the same material as the electrode 15, such as tungsten. The metal layer 34 is formed from the same material as the metal layer 14. The metal layer 34 contains e.g. silver, cobalt, nickel, or copper. The metal layer 34 is formed from e.g. silver. The resistance change layer 33 is formed from the same material as the resistance change layer 13. The resistance change layer 33 is formed from e.g. amorphous silicon or silicon oxide.

A word line 32 extending in the X-direction is provided on the electrode 31. The word lines 32 are provided in a plurality and arranged periodically along the Y-direction. Each word line 32 is placed directly above the word line 12. The word line 32 is formed from the same material as the word line 12, such as tungsten.

Thus, in the memory device 2, the word line 32 is provided on the bit line 18. The pillar 36 is connected between the bit line 18 and the word line 32. Like the pillar 16, the pillar 36 can also constitute a memory cell.

According to the embodiment, the memory cells can be integrated in three dimensions. This can further increase the memory density per unit area. The configuration, manufacturing method, operation, and effect of the embodiment other than the foregoing are similar to those of the above first embodiment.

In the embodiment, another pillar including a resistance change film may be provided on the word line 32, and a bit line extending in the Y-direction may be provided on the pillar. Thus, word line wiring layers each including a plurality of word lines extending in the X-direction and bit line wiring layers each including a plurality of bit lines extending in the Y-direction may be alternately stacked on the silicon substrate 10. A pillar including a resistance change film may be connected between each word line and each bit line. This can realize a memory device including a plurality of word line wiring layers and bit line wiring layers in which memory cells are stacked in three or more stages.

Also in this case, an insulating film is provided on the upper surface and the lower surface of each bit line. A high resistance film is provided on the side surface of the stacked body composed of each bit line and two insulating films provided on the upper and lower surfaces of the bit line. The high resistance film is connected to the electrode by bringing the end surface of the high resistance film into contact with the electrode. Thus, the bit line is connected to the electrode through the high resistance film without bringing the bit line into contact with the electrode. On the other hand, the resistance change film is connected between the word line and the high resistance film.

The above embodiments have been described with reference to an example in which the resistance change film is a stacked film including a resistance change layer and a metal layer. However, the resistance change film is not limited thereto. For instance, the resistance change film may be a monolayer film made of metal oxide.

The embodiments described above can realize a memory device being easy to manufacture, and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device comprising:
    a substrate;
    a first resistance changeable film;
    a second resistance changeable film provided apart from the first resistance changeable film in a first direction perpendicular to a surface of the substrate;
    a first wiring provided between the first resistance changeable film and the second resistance changeable film in the first direction, the first wiring extending in a second direction parallel to the surface of the substrate;
    a first film provided between the first wiring and the first resistance changeable film in the first direction, the first film having a higher resistivity than the first wiring;
    a second film provided between the first wiring and the second resistance changeable film in the first direction, the second film having a higher resistivity than the first wiring;
    a first sidewall film facing to a first side surface of a stacked structure including the second film and the first wiring in a third direction crossing the first direction and the second direction, the first sidewall film having a higher resistivity than the first wiring;
    a second sidewall film facing to a second side surface of the stacked structure in the third direction, the second sidewall film having a higher resistivity than the first wiring;
    a third film facing to the first sidewall film in the third direction, the third film being thicker than the first sidewall film in the third direction;
    a fourth film facing to the second sidewall film in the third direction, the fourth film being thicker than the second sidewall film in the third direction;
    a second wiring provided above the first resistance changeable film in the first direction and electrically coupled to the first resistance changeable film, the second wiring extending in the third direction; and
    a third wiring provided below the second resistance changeable film in the first direction and electrically coupled to the second resistance changeable film, the third wiring extending in the third direction.

2. The memory device according to claim 1, further comprising a first electrode provided between the first resistance changeable film and the first film in the first direction.

3. The memory device according to claim 1, further comprising a metal film provided between the first resistance changeable film and the first electrode in the first direction.

4. The memory device according to claim 1 further comprising a second electrode provided between the second resistance changeable film and the second film in the first direction.

5. The memory device according to claim 1, further comprising:
    a third resistance changeable film being adjacent to the first resistance changeable film in the third direction;
    a fourth resistance changeable film being adjacent to the second resistance changeable film in the third direction;
    a fourth wiring provided between the third resistance changeable film and the fourth resistance changeable film in the first direction;
    a fifth film provided between the fourth wiring and the third resistance changeable film in the first direction, the fifth film having a higher resistivity than the fourth wiring;
    a sixth film provided between the fourth wiring and the fourth resistance changeable film in the first direction, the sixth film having a higher resistivity than the fourth wiring;
    a third sidewall film facing to a first side surface of a second stacked structure including the sixth film and the fourth wiring in the third direction, the third sidewall film having a higher resistivity than the fourth wiring;
    a fourth sidewall film facing to a second side surface of the second stacked structure, the fourth sidewall film having a higher resistivity than the fourth wiring.

6. The memory device according to claim 5, further comprising a plurality of third electrodes, each of which respectively provided between the first resistance changeable film and the second wiring, and between the third resistance changeable film and the second wiring.

7. The memory device according to claim 5, wherein the third resistance changeable film is electrically coupled to the second wiring, and the fourth resistance changeable film is electrically coupled to the third wiring.

8. The memory device according to claim 5, further comprising a plurality of fourth electrodes, each of which respectively provided between the second changeable film and the third wiring, and the fourth changeable film and the third wiring.

9. The memory device according to claim 5, wherein the fourth film is thicker than the third sidewall film in the third direction.

10. A memory device comprising:
a substrate;
a first resistance changeable film;
a second resistance changeable film being separated from the first resistance changeable film in a first direction perpendicular to a surface of the substrate;
a first wiring being provided between the first resistance changeable film and the second resistance changeable film, the first wiring extending in a second direction parallel to the surface of the substrate;
a second wiring being provided above the first resistance changeable film in the first direction and being electrically coupled to the first resistance changeable film, the second wiring extending in a third direction parallel to the surface of the substrate;
a third wiring being provided below the second resistance changeable film in the first direction and being electrically coupled to the second resistance changeable film, the third wiring extending in the third direction;
a first film provided between the first wiring and the first resistance changeable film in the first direction, the first film having a higher resistivity than the first wring;
a second film provided between the first wiring and the second resistance changeable film in the first direction, the second film having a higher resistivity than the first wiring;
a first sidewall film of which one side surface faces to a first side surface of a stacked structure including the second film and the first wiring in the third direction, the first sidewall film having a higher resistivity than the first wiring;
a second sidewall film of which one side surface faces to a second side surface of the stacked structure, the second sidewall film having a higher resistivity than the first wiring;
a third film being in contact with the other side surface of the first sidewall film in the third direction, the third film being thicker than the first sidewall film in the third direction;
a fourth film being in contact with the other side surface of the second sidewall film, the fourth film being thicker than the second sidewall film in the third direction;
a fourth wiring being apart from the second wiring in the second direction, the fourth wiring extending in the third direction;
a fifth wiring being apart from the third wiring in the second direction, the fifth wiring extending in the third direction;
a third resistance changeable film being apart from the first resistance changeable film in the second direction and being provided between the first wiring and the fourth wiring in the first direction;
a fourth resistance changeable film being apart from the second resistance changeable film in the second direction and being provided between the first wiring and the fifth wiring in the first direction;
a fifth film being provided between the third resistance changeable film and the first wiring in the first direction;
a sixth film being provided between fourth resistance changeable film and the first wiring in the first direction;
a third sidewall film facing to a first side surface of a stacked structure including the sixth film and the first wiring in the third direction, the third sidewall film having a higher resistivity than the first wiring; and
a fourth sidewall film facing to a second side surface of the stacked structure, the fourth sidewall film having a higher resistivity than the first wiring.

11. The memory device according to claim 10, further comprising a first electrode provided between the first resistance changeable film and the first film in the first direction.

12. The memory device according to claim 10, further comprising a metal film provided between the first resistance changeable film and the first electrode in the first direction.

13. The memory device according to claim 10, further comprising a second electrode provided between the second resistance changeable film and the second film in the first direction.

14. The memory device according to claim 13, wherein the fifth resistance changeable film is provided between the second wiring and the sixth wiring, the fifth resistance changeable film is electrically coupled to the second wiring, and the sixth resistance changeable film is provided between the third wiring and the sixth wiring in the first direction, the sixth resistance changeable film is electrically coupled to the third wiring.

15. The memory device according to claim 10, further comprising:
a fifth resistance changeable film being adjacent to the first resistance changeable film in the third direction;
a sixth resistance changeable film being adjacent to the second resistance changeable film in the third direction;
a sixth wiring being provided between the fifth resistance changeable film and the sixth resistance changeable film in the first direction, the sixth wiring extending in the second direction;
a seventh film being provided between the sixth wiring and the fifth resistance changeable film in the first direction;
an eighth film being provided between the sixth wiring and the sixth resistance changeable film in the first direction;
a fifth side film facing to one side surface of a stacked structure including the eighth film and the sixth wiring in the third direction, the fifth sidewall film having a higher resistivity than the first wiring; and
a sixth sidewall film facing to another side surface of the stacked structure including the eighth film, the sixth sidewall film having a higher resistivity than the sixth wiring.

16. The memory device according to claim 10, wherein the third sidewall film and the first sidewall film are continuously formed in the second direction, and the fourth sidewall film and the second sidewall film are continuously formed in the second direction.

17. A memory device comprising:
a substrate;
a first resistance changeable film;
a second resistance changeable film provided apart from the first resistance changeable film in a first direction perpendicular to a surface of the substrate;
a first wiring provided between the first resistance changeable film and the second resistance changeable film in the first direction, the first wiring extending in a second direction parallel to the surface of the substrate;

a first film provided between the first wiring and the first resistance changeable film in the first direction, the first film having a higher resistivity than the first wring;

a second film provided between the first wiring and the second resistance changeable film in the first direction, the second film having a higher resistivity than the first wiring;

a first sidewall film of which a first side surface faces to a first side surface of a stacked structure including the second film and the first wiring in a third direction crossing the first direction and the second direction, the first sidewall film having a higher resistivity than the first wiring;

a second sidewall film of which a first side surface faces to a second side surface of the stacked structure, the second sidewall film having a higher resistivity than the first wiring;

a third film being in contact with the second side surface of the first sidewall film, the third film being thicker than the first sidewall film in the third direction; and a fourth film being in contact with a second side surface of the second sidewall film, the fourth film being thicker than the second sidewall film in the third direction.

18. The memory device according to claim 17, further comprising a first electrode provided between the first resistance changeable film and the first film in the first direction.

19. The memory device according to claim 17, further comprising a metal film provided between the first resistance changeable film and the first electrode in the first direction.

20. The memory device according to claim 17, further comprising:

a second wiring provided above the first resistance changeable film in the first direction and electrically coupled to the first resistance changeable film, the second wiring extending in the third direction; and a third wiring provided below the second resistance changeable film in the first direction and electrically coupled to the second resistance changeable film, the third wiring extending in the third direction.

\* \* \* \* \*